US007804704B2

(12) United States Patent
Sousa

(10) Patent No.: US 7,804,704 B2
(45) Date of Patent: Sep. 28, 2010

(54) PMC MEMORY WITH IMPROVED RETENTION TIME AND WRITING SPEED

(75) Inventor: Veronique Sousa, Grenoble (FR)

(73) Assignee: Commissariat A l'Energie Atomique, Paris (FR)

( * ) Notice: Subject to any disclaimer, the term of this patent is extended or adjusted under 35 U.S.C. 154(b) by 396 days.

(21) Appl. No.: 11/722,761

(22) PCT Filed: Dec. 20, 2005

(86) PCT No.: PCT/FR2005/051114

§ 371 (c)(1), (2), (4) Date: Jun. 25, 2007

(87) PCT Pub. No.: WO2006/070151

PCT Pub. Date: Jul. 6, 2006

(65) Prior Publication Data

US 2008/0007997 A1 Jan. 10, 2008

(30) Foreign Application Priority Data

Dec. 23, 2004 (FR) .................................. 04 53210

(51) Int. Cl.
*G11C 11/00* (2006.01)

(52) U.S. Cl. ........................ 365/153; 257/296; 257/508

(58) Field of Classification Search ................. 365/153; 257/200, 508; 258/296
See application file for complete search history.

(56) References Cited

U.S. PATENT DOCUMENTS 933,365 A 9/1909 Cory et al.
4,115,872 A 9/1978 Bluhm
4,177,475 A 12/1979 Holmberg
5,363,329 A 11/1994 Troyan
5,761,115 A 6/1998 Kozicki et al.
5,933,365 A 8/1999 Klersy et al.
6,348,365 B1 2/2002 Moore et al.
6,855,975 B2 2/2005 Gilton (Continued)

FOREIGN PATENT DOCUMENTS

JP 62-205598 9/1987

(Continued)

OTHER PUBLICATIONS

E. Bychkov, et al., "Percolation Transition in AG-Doped Gemanium Chalcogenide Based Glasses: Conductivity and Silver Diffusion Results", Journal of Non-Crystalline Solids 208, 1996, pp. 1-20.

(Continued)

*Primary Examiner*—Tuan T Nguyen
*Assistant Examiner*—Toan Le
(74) *Attorney, Agent, or Firm*—Oblon, Spivak, McClelland, Maier & Neustadt, L.L.P.

(57) ABSTRACT

A PMC memory including: a memory cell, the memory cell including, an active zone, a heating element disposed outside of the active zone, and at least two contacts that apply a writing voltage to the memory cell, wherein the heating element transitionally heats the memory cell-during a writing process in the memory cell to a writing temperature higher than an operating temperature of the memory cell outside the writing process.

21 Claims, 4 Drawing Sheets

U.S. PATENT DOCUMENTS

| | | | | |
|---|---|---|---|---|
| 6,864,521 | B2 | 3/2005 | Moore et al. | |
| 6,864,522 | B2 | 3/2005 | Krieger et al. | |
| 6,878,569 | B2 | 4/2005 | Li | |
| 6,985,378 | B2 * | 1/2006 | Kozicki | 365/153 |
| 7,050,327 | B2 * | 5/2006 | Campbell | 365/159 |
| 7,071,021 | B2 * | 7/2006 | Harshfield et al. | 438/95 |
| 7,279,418 | B2 | 10/2007 | Bechevet et al. | |
| 2002/0127886 | A1 | 9/2002 | Moore et al. | |
| 2003/0043631 | A1 | 3/2003 | Gilton et al. | |
| 2003/0045049 | A1 | 3/2003 | Campbell et al. | |
| 2003/0052330 | A1 | 3/2003 | Klein | |
| 2003/0123282 | A1 | 7/2003 | Nickel et al. | |
| 2003/0209728 | A1 | 11/2003 | Kozicki et al. | |
| 2003/0209971 | A1 | 11/2003 | Kozicki | |
| 2004/0157417 | A1 * | 8/2004 | Moore et al. | 438/510 |
| 2004/0192006 | A1 | 9/2004 | Campbell et al. | |
| 2004/0228164 | A1 | 11/2004 | Gilton | |
| 2005/0104105 | A1 | 5/2005 | Campbell | |
| 2005/0127524 | A1 * | 6/2005 | Sakamoto et al. | 257/774 |
| 2005/0128794 | A1 | 6/2005 | Sussner | |
| 2005/0162907 | A1 | 7/2005 | Campbell et al. | |
| 2006/0046444 | A1 | 3/2006 | Campbell et al. | |
| 2006/0099822 | A1 | 5/2006 | Harshfield et al. | |
| 2007/0072125 | A1 | 3/2007 | Sousa et al. | |
| 2007/0148882 | A1 | 6/2007 | Dressler et al. | |
| 2008/0007997 | A1 | 1/2008 | Sousa | |

FOREIGN PATENT DOCUMENTS

| | | |
|---|---|---|
| WO | 03/019691 | 3/2003 |
| WO | 03/020998 | 3/2003 |
| WO | 2006/034946 | 4/2006 |

OTHER PUBLICATIONS

Manabu Kawasaki, et al., Ionic Conductivity of $Ag_x$ $(GeSe_3)_{1-x}$ (0 ≦x ≦0.571) Glasses, Solid State Ionics 123, 1999, pp. 259-269.

Wang et al; "Structure and property characterization of Bi2-xSbxTe3 thermoelectric firms prepared by electrodeposition" Wuji Cailiao Xuebao—Journal of Inorganic Materials, Beijing, CN, vol. 20. No. 5, Sep. 2005, pp. 1234-1238.

Neale; "Micron to look again at non-volatile amorphous memory", Electronic Engineering, Morgan Grampian Ltd., London, GB, vol. 74, Apr. 2002, pp. 56-64.

Anonymous; "Copper, CU; Annealed", MATWEB Datasheet, [Online] XP002476474, URL:http://wwwk.matweb.com/search/datasheet_print.aspx?matid=28>.

Anonymous; "Silver, Ag" MATWEB Datasheet, [Online] XP002476475 URL: http://www.matweb.com/search/DataSheet.aspx?MatID=2>.

Anonymous; "Tellurium, Te" MATWEB Datasheet, [Online] XP002476476 URL: http://www.matweb.com/search/datasheet_print.sapx?MatdD=113>.

French Search Report.

Romero et al.; "A transmission electron microscope study of metal/chalcogenide amorphous thin films", Applied Surface Science 234 (2004) pp. 369-373.

Calas et al; "Study of isotopic silver dissolution in vitreous GeSe thin films from secondary ion mass spectrometry measurements" Materials Science and engineering, B13 (1992) pp. 309-317 XP-002476161.

Bychkov et al; "Percolation transition in Ag-doped germanium chalcogenide-based glasses: conductivity and silver diffusion results" Journal of Non-Crystalline Solids 208 (1996).

Kawasaki et al; "Ionic conductivity of Agx(GeSe3) 1-x (0<x<0.571)glasses" Solid State Ionics 123 (1999) pp. 259-269.

* cited by examiner

PMC MEMORY WITH IMPROVED RETENTION TIME AND WRITING SPEED

TECHNICAL FIELD AND PRIOR ART

The invention concerns the domain of rewritable memories, more particularly non-volatile memories.

As a function of the applications and performances targeted, different types of memories are utilised.

When ultra-rapid writing times are required (such as during calculation by a micro-processor for example), SRAM memories constituted by the arrangement of several transistors are employed.

The disadvantage to these memories is that they are volatile and the size of the memory point, relatively large, does not allow large storage capacity.

For large storage capacity DRAM memories where electrical charges are loaded on a capacitor are used.

These memories have faster writing times (a few 10 ns) and they are also volatile, the retention time of the information being of the order of a few 10 ms. Finally, for applications requiring storage of information even when voltage is cut off, EEPROM memories or FLASH memories are used which store charges on the floating grid of a transistor with field effect. These memories are non-volatile. The disadvantages to this type of memory are long writing times (several micro-seconds) and cyclability limited to 10E6 writing cycles.

The operating principle of rewritable non-volatile memories currently in use (EEPROM or Flash memories) rests on storing electrical charges on the floating grid of transistors with field effect.

Each memory point is therefore constituted by one or more silicon components whereof the reduction in size results in a decrease in the reading signal and a decrease in the duration of information retention. It is clear therefore that the density of this type of memory is limited.

Also, these memories have relatively long writing times (several micro-seconds) since this is the time necessary for the electrons to pass to the floating grid by tunnel effect.

These memories are likewise limited in cyclability ($10^6$). In fact, retention diminishes throughout the writing cycles since the creation of defects in the oxide allows the electrons to escape from the floating grid.

Different memory designs are envisaged for the new generations of rewritable non-volatile memories.

The active materials can be ferro-electric materials (FE-RAM memories), or magnetic materials (MRAM memories), or phase-changing materials (PC-RAM memories) or ionic-conduction materials (PMC memories).

The invention refers especially to the field of PMC memories.

A PMC memory cell and a matrix of memory points according to the prior art are respectively presented in FIGS. 1 and 2.

The operating principle of the PMC memories rests on the migration of ions (for example $Ag^+$) in a solid electrolyte 4 (for example GeSe) placed between an inert cathode 6 (for example Ni) and a soluble anode 8 (for example Ag).

Reference numerals 10, 12 represent contact points, and reference numeral 14 represents an insulating medium.

The reading signal results from the difference in electrical resistivity between the two ON and OFF states.

In the OFF state, ions are dispersed in the matrix forming a phase of major resistivity. By applying a difference in potential of a few 100 mV between the anode and the cathode in the form of an impulse of a few 10 ns, the ions migrate to the cathode 6 by forming a metallic deposit. This creates the ON state, of low resistivity.

By applying a difference in potential of the same intensity and duration but of opposite sign, the metallic deposit breaks up again in the form of ions in the electrolyte and the OFF state returns.

FIG. 2 illustrates a matrix of 4 PMC memory points such as described hereinabove, controlled by WL line signals and BL columns.

The principal advantage of PMC memories is that the writing voltages, under 1V, are low relative to that of the other non-volatile memories (EEPROM, MRAM, PCRAM).

The disadvantage of the PMC memories such as described in the state of the art (such as for example in the U.S. Pat. No. 5,761,115) is that they do not simultaneously produce a short writing time and a long retention time, these 2 parameters varying in the opposite direction: when a rapid writing speed is reached, the retention time is too short, and when the latter becomes longer a general slowing of the writing is evident.

Therefore the problem arises of finding a memory of PMC type whereof the structure and the operating are compatible with a rapid writing time and a long retention time.

EXPLANATION OF THE INVENTION

The invention concerns a PMC memory whereof the retention time and the writing speed are optimised at the same time.

The invention proposes a PMC structure comprising a heating element so that the temperature of the active material increases locally and transitionally at the time of writing.

The invention concerns a PMC memory comprising a memory cell and means for heating the cell during writing in the memory.

A PMC memory according to the invention sees its temperature increase locally at the level of the memory point and transitionally at the time of writing.

The operating temperature (Tf) of the memory is called the temperature of a memory point outside the writing stage. In general, when the memory is being used this temperature is slightly greater than the ambient temperature, of the order of 80° C.

The writing temperature (Te) of the memory is called the temperature reached during the writing stage. In the PMC memories of the prior art, the writing temperature Te is equal to the operating temperature Tf.

In a PMC structure of the prior art, the temperatures Te and Tf are combined.

In a PMC structure according to the invention, the writing temperature Te is higher than the operating temperature Tf, while remaining less than the vitreous transition temperature of the material making up the active element of the memory, for example amorphous chalcogenide.

The invention differentiates between the temperature Te and Tf and obtains a better compromise between the writing speed and the retention time.

By using such a thermally assisted writing memory, the temperature of the memory point is augmented locally and transitionally at the time of writing, for example at a temperature between 300 K and 450 K.

The invention makes use of a system whereof the chemical diffusion coefficient is low at the operating temperature of the memory, but whereof the diffusion coefficient under electrical field is high during writing.

This results in a simultaneous increase in the retention time and the writing speed.

The invention therefore optimises the writing speed and the retention time of a PMC memory.

The memory cell can comprise a solid electrolyte comprising a material of chalcogenide type, capable of being metal-doped, for example of AgGeSe type or AgGeSbSe type or AgGeS type or AsS type.

The solid electrolyte can be an oxide, for example WO3.

Means can further be provided to form a thermal barrier, in particular to the side opposite the heating means in the cell.

The heating means can be placed near the active zone, or can be separated therefrom by at least one electrode.

They can be placed in contact with the inert cathode, or can be separated therefrom by at least one contact electrode of the inert cathode.

A memory according to the invention can comprise 3 contacts, including one common to the heating means and the cell, or 4 contacts, including two for the heating means and two for the cell.

Owing to the choice of the compositions of the materials, the diffusion speed of the metal in the active zone as well as the variation of this speed with the temperature can be controlled.

The structure of the cell, in particular the relative position of the heating element and of the active element in the cell, can be further optimised to obtain thermally assisted writing.

The same applies to the writing pulse parameters, and heating pulse parameters.

The invention likewise relates to a matrix of memories of PMC type such as described hereinabove, comprising addressing means of lines, addressing means of columns, and addressing means of heating elements.

DETAILED EXPLANATION OF PARTICULAR EMBODIMENTS

Figure 3A:
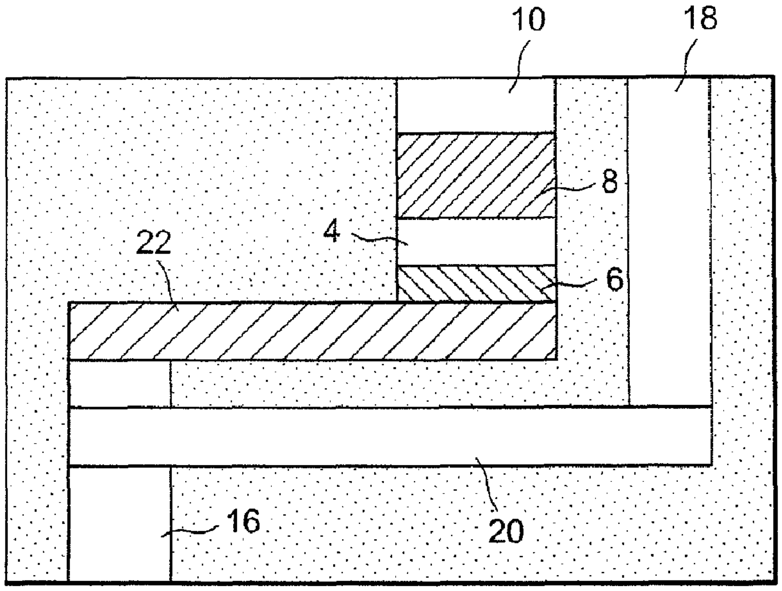
FIGS. 3A-3C illustrate three embodiments of the invention.

A first example of a PMC memory according to the invention is illustrated in FIG. 3A.

A heating element 20, such as a heating resistor, is placed near the active zone 4. It can be activated by two contacts 16, 18.

During operation, a current passes through it and produces heat by Joule effect, the heat then transmitted to the active zone 4 by conduction.

A heating element can be associated with each active element according to the diagram in FIG. 3A.

Figure 3B:
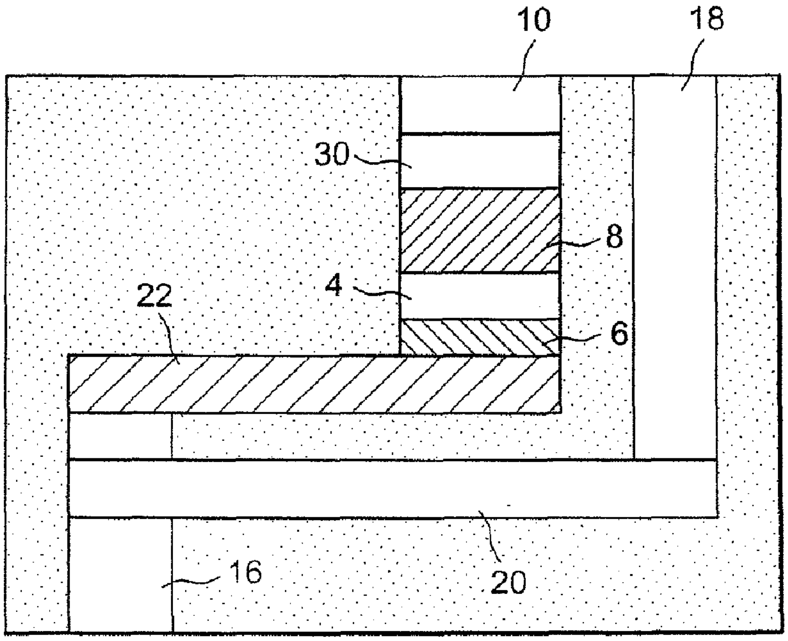

To boost the efficacy of the heating, a thermal barrier 30 can be added to the side opposite the heating element, as illustrated in FIG. 3B. This barrier is placed for example between the anode 8 and the contact 10.

Figure 3C:
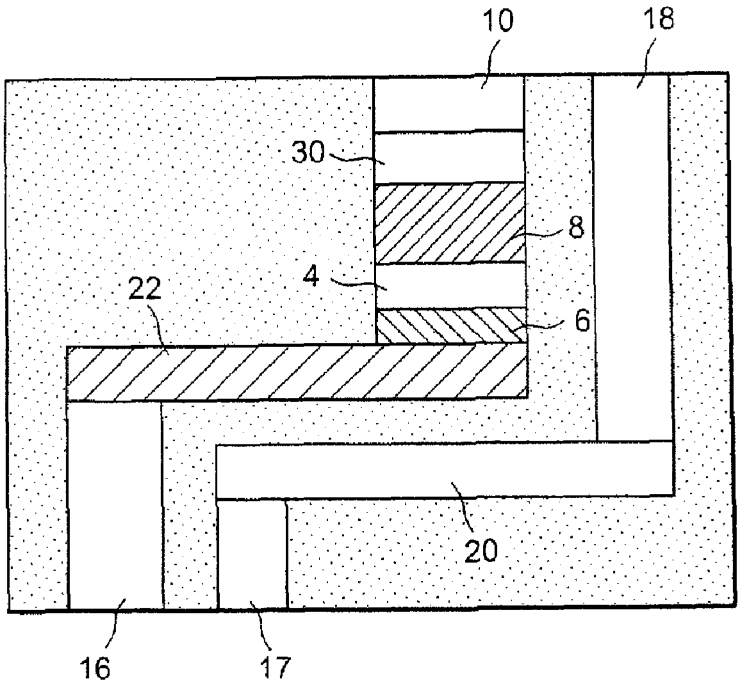

Another example is given in FIG. 3C, where the heating means are independent of the active element: this gives 4 terminals 10, 16, 17, 18, two for the active element and two for the heating element.

In all three cases, the structure can be optimised further by bringing the heating element as close as possible to the active element 4, but avoiding any short circuit between the anode and the cathode.

Figure 1:
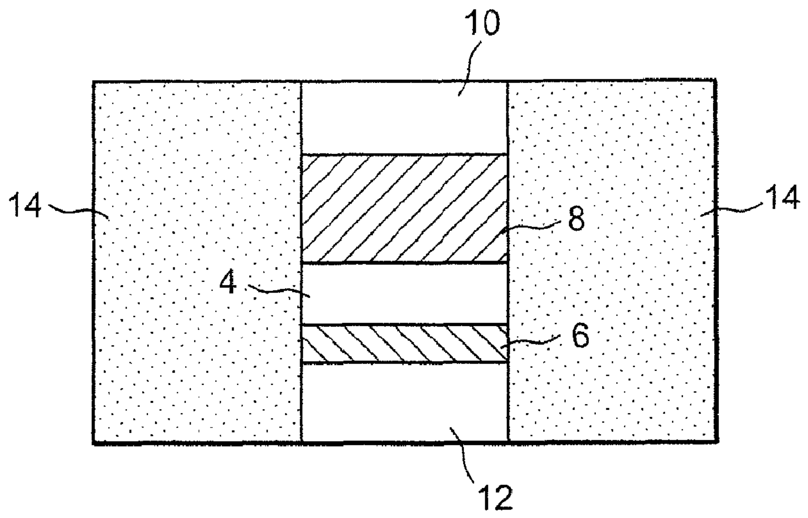
FIG. 1 illustrates a known device of PMC type.
Figure 2:
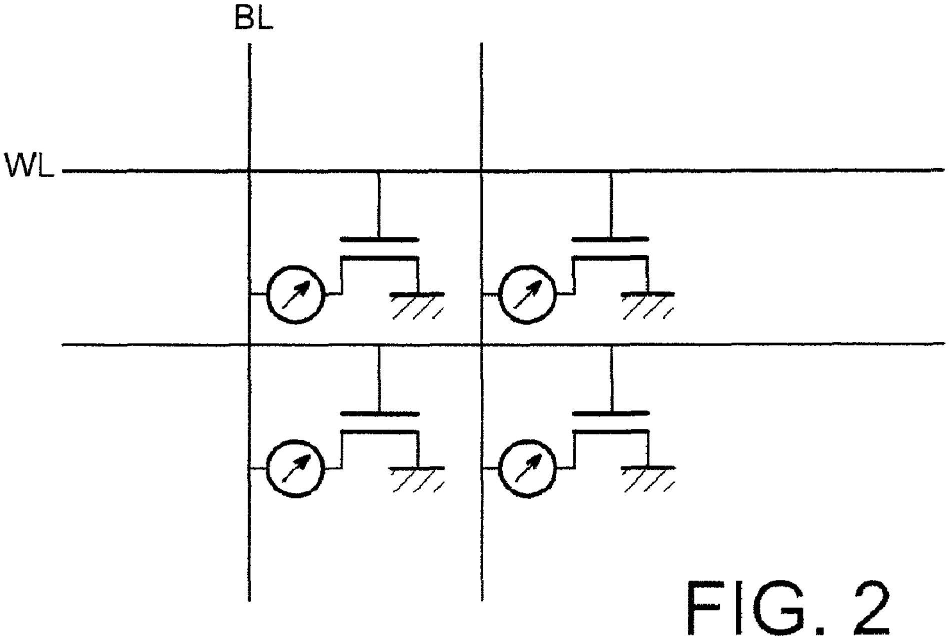
FIG. 2 illustrates a matrix of PMC memories according to the prior art.
Figure 4:
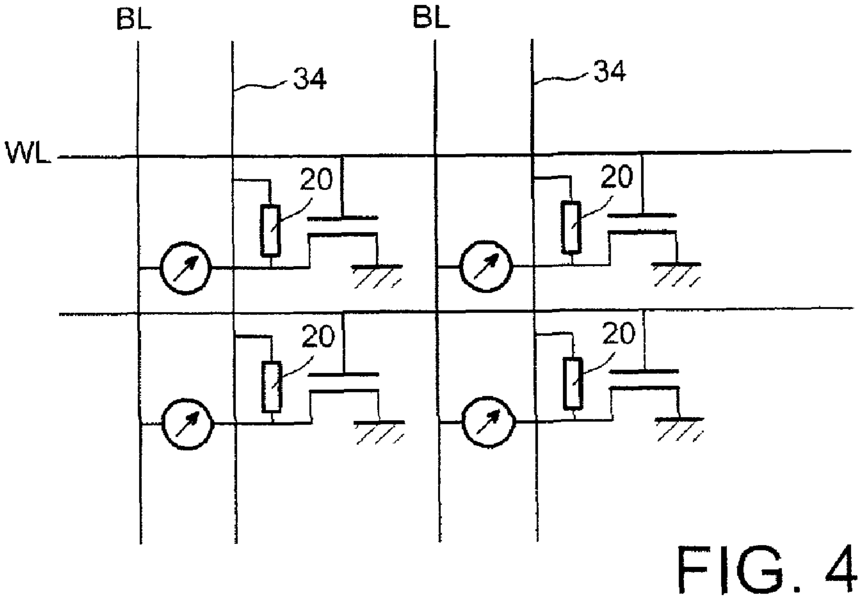
FIG. 4 illustrates a matrix of PMC memories according to the invention.

A diagram of a matrix of memory points according to the invention is presented in FIG. 4: relative to the basic configuration (FIG. 2), a line 34 is added which allows the current to be passed through each heating element 20.

Figure 5:
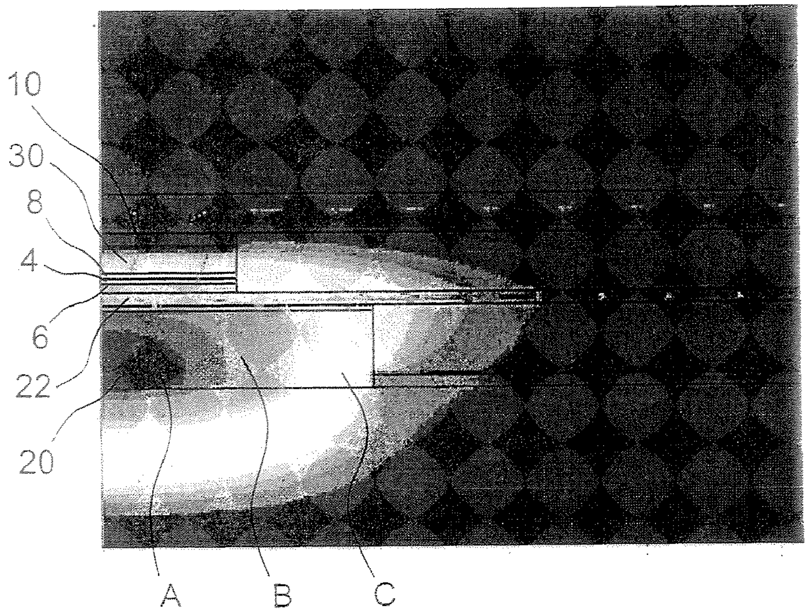
FIG. 5 illustrates a result of electro-thermal simulation showing local reheating of a PMC memory according to the invention.

The result of the electro-thermal simulation of this structure, shown in FIG. 5, shows local heating of the memory point of 140 K during writing. The simulation conditions are the following: active AgGeSe element 1 µm in diameter, TiN heating element, heating pulse 0.6 V, presence of an upper thermal barrier (FIG. 3B). This figure shows the elements of a memory point according to the invention, having the reference numerals of FIG. 3B. Zone A is the zone in which the temperatures are the highest, then comes zone B having lesser temperatures than zone A, followed by zone C having even lesser temperatures than zone B.

Figure 6:
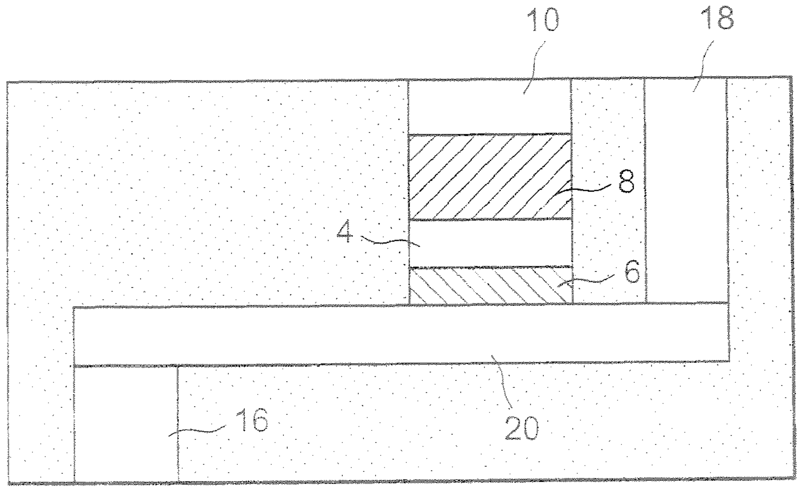
FIG. 6 illustrates another embodiment of the invention.

Other configurations resulting in local and transitional heating during the writing stage are possible, for example that proposed in FIG. 6: a heating element 20 is placed directly under the inert cathode 6, with no contact being made between the anode 8 and the cathode 6. The heating element 20 can even be used as a cathode 6.

The result is a device with 3 contacts 10, 16, 18, the application of voltage between the contacts 10 and 16 allowing writing in the cell 4, the application of voltage between the contacts 16 and 18 allowing heating.

The configuration, the dimensions and the material of the heating element can be optimised as a function of the rise in preferred temperature due to electro-thermal simulations.

For these simulations commercial multiphysical modelling software can be used such as for example FEMLAB software which delivered the results presented in FIG. 5.

The invention allows dissociation of the phenomena of retention and writing by local and transitional increase of the temperature at the time of writing.

It enables optimisation of the retention time and the writing speed.

Different materials, in particular of chalcogenide type, can be utilised within the scope of the invention.

Table I mentions the properties of different Ag-doped chalcongenide materials: in this table Tg illustrates the vitreous transition temperature, G illustrates the migration flow ratio at 300 K and 450 K (G is also equal to the ratio of ionic conductivities at these two temperatures). The data are extracted from the following documents. E. Bychkov et al., <<Percolation transition in Ag doped germanium chalcogenide based glasses: conductivity and silver diffusion>>, Journal of non-crystalline solids 208 (1996) p 1, for materials 2-4, and M. Kawasaki et al., <<Ionic conductivity of $Ag_x$ $(GeSe_3)_{1-x}$ glasses>>, Solid State Ionics 123 (1999) p. 259, for material 1.

TABLE 1

Properties of Ag-doped chalcogenide materials

| N° | Material | at % Ag | Tg (° C.) | σ ($\Omega^{-1} \cdot cm^{-1}$) @300 K | σ ($\Omega^{-1} \cdot cm^{-1}$) @450 K | Ea (eV) | G | D ($cm^2 \cdot s^{-1}$) (300 K) |
|---|---|---|---|---|---|---|---|---|
| 1 | $Ag_{25}Ge_{19}Se_{56}$ | 25 | 240 | $2.6e^{-4}$ | $1.2e^{-2}$ | 0.33 | 50 | No data |
| 2 | $Ag_{25}Ge_{29}S_{46}$ | 25 | 330 | $7e^{-6}$ | $7.5e^{-4}$ | 0.393 | 110 | $3.2e^{-11}$ |
| 3 | AgGeS | 20 | 300 | $3e^{-8}$ | $3.3e^{-6}$ | 0.395 | 110 | $1e^{-12}$ |
| 4 | $Ag_{22}Ge_{22}Sb_9Se_{47}$ | 22.5 | ? | $1.7e^{-5}$ | $1.9e^{-3}$ | 0.395 | 110 | $5e^{-11}$ |

The advantages of each of these materials employed in combination with the invention are the following.

Material No. 1: This is the material utilised in the prior art. A device according to the invention using this material can multiply the writing speed by 50 without degrading the retention time (G corresponds to the factor allowing the writing speed to be multiplied).

Material No. 2: This is another material in which the chalcogenide element is no longer Se but S. This material is utilised for its higher vitreous transition temperature, despite a slower writing speed than material No. 1. A device according to the invention using this material reveals a faster writing speed than with material No. 1, while retaining the benefit of the higher vitreous transition temperature of material No. 2.

Material No. 3: This is material No. 2, with a lower Ag content. This is a material which is not used conventionally as the expected writing speed is slow. A device according to the invention employing this material reveals the writing speed of material No. 2 by benefiting from a retention time 30 times greater. The vitreous transition temperature is likewise higher than for material No. 1. This material makes a fine compromise.

Material No. 4: This is material No. 1 with a lower chalcogenide element content obtained by replacing part of the Se atoms by Sb. With decreasing of the chalcogenide element content a slower Ag diffusion speed is expected. This is why this material is not conventionally used, since its writing speed expected is slow. A device according to the invention using this material simultaneously provides improved writing speed and retention time relative to material No. 1.

In these examples and by way of comparison, it was supposed that the writing temperature Te is 450K, because this temperature is lower than the vitreous transition temperatures of all the abovementioned materials. It is possible to increase the writing temperature to the vitreous transition temperature of the materials in each of the cases to further boost the writing speed.

According to one example a cell according to the invention can have the following typical dimensions:

diameter of the photodoped chalcogenide terminal: under 1 μm, preferably under 0.1 μm, diameter of the heating element 20: of the same order of magnitude as the diameter or the maximum size of the doped chalcogenide terminal and preferably more than the diameter of the chalcogenide terminal; preferably still the diameter of the heating element is under 1 μm and preferably still under 0.1 μm.

thickness of the layers:

a—lower 6 and upper 8 electrodes: 50 nm-200 nm, b—photodoped chalcogenide 4, between 20 nm and 40 nm in thickness, c—heating element 20: thickness between 100 nm and 200 nm.

By way of example a cell according to the invention can make use of the following compositions of metals and chalcogenides:

First example: the metal is Ag and the chalcogenide is GeSe, or GeS, or GeSbSe.

Second example: the metal is Cu and the chalcogenide is AsS.

A first procedural example for making a device according to the invention will be given. This is the device described hereinabove in relation to FIG. 3A.

The first step is manufacturing the addressing transistors.

Next, the lower contact 16 of the heating element 20 is made, then the heating element 20 itself.

The insulation is then deposited.

The next step is manufacturing the lower contact 22 of the active element, then making the lower electrode 22.

A trilayer is then deposited: inert cathode 6/chalcogenide 4/metal, followed by photodissolution. The anode is then deposited.

Next, this stack is lithographed and etched in the form of a terminal.

An insulating material (e.g. SiO2) is deposited then planed.

The upper electrode 10 is then made. Finally, the contact 18 to the heating element is restored.

A second procedural example for making a device according to the invention will be given. This is the device described hereinabove in relation to FIG. 6.

The first step is manufacturing the addressing transistors.

Next, the lower contact 16 of the heating element is made, then the heating element 20 itself.

A trilayer is then deposited: inert cathode 6/chalcogenide 4/metal, followed by photodissolution. The anode is then deposited.

Next, this stack is lithographed and etched in the form of a terminal.

An insulating material (e.g. SiO2) is deposited then planed.

The upper electrode 10 is then made. Finally, the contact 18 to the heating element is restored.

The invention applies to non-volatile rewritable memories of PMC type.

By local and transitional heating by a heating element during the writing period the invention can separately optimise the retention time and the writing speed in a PMC memory.

During writing a temperature of around 150° C. can be reached, favouring the diffusion coefficient of the species in the active zone, under an electrical field, and therefore the writing speed.

Next, a lower temperature, for example of around 80° C., creates an improved retention time without spontaneous dissolution of the conductive deposit.

Solid diffusion and migration of the metal in the active zone, under an electrical field, during writing, are attained due to a high diffusion coefficient at the writing temperature (~150° C.). The result is an improved writing speed.

According to the invention, the heating elements, such as heating resistors, are placed in parallel to the active elements. The active material is highly resistive and a weak current passes through it. The heating is done by localised heating elements at the memory point.

The invention claimed is:

1. A PMC memory comprising:
a memory cell, said memory cell including,
an active zone,
a heating element disposed outside of the active zone, and
at least two contacts that apply a writing voltage to the memory cell,
wherein the heating element transitionally heats the memory cell during a writing process in the memory cell to a writing temperature higher than an operating temperature of the memory cell outside the writing process.

2. The memory as claimed in claim 1, wherein said memory cell includes a solid electrolyte that includes a chalcogenide material.

3. The memory as claimed in claim 2, wherein said solid electrolyte is an oxide.

4. The memory as claimed in claim 2, wherein said chalcogenide material is doped with metal.

5. The memory as claimed in claim 4, wherein said metal-doped chalcogenide is AgGeSe.

6. The memory as claimed in claim 4, wherein said metal-doped chalcogenide is AgGeSbSe.

7. The memory as claimed in claim 4, wherein said metal-doped chalcogenide is AgGeS.

8. The memory as claimed in claim 4, wherein said metal-doped chalcogenide is copper-doped AsS.

9. The memory as claimed in claim 2, wherein said chalcogenide material is AsS.

10. The memory as claimed in claim 1, further comprising a thermal barrier.

11. The memory as claimed in claim 1, further comprising an inert cathode, wherein said heating element is in contact with the inert cathode.

12. The memory as claimed in claim 1, further comprising an inert cathode, wherein said heating element is separated from the inert cathode by at least one contact electrode of the inert cathode.

13. The memory as claimed in claim 1, wherein the at least two contacts includes three contacts, and only one contact of the three contacts is common to the memory cell and the heating element.

14. The memory as claimed in claim 1, wherein the at least two contacts includes four contacts with two contacts for the memory cell and two contacts for the heating element.

15. A memory matrix comprising:
a plurality of the PMC memory of claim 1;
means for addressing lines of the memory matrix;
means for addressing columns of the memory matrix; and
means for addressing heating elements of the memory matrix.

16. The memory according to claim 1, wherein the at least two contacts includes three contacts, and application of voltage between a first two of the three contacts applies the writing voltage to the cell and application of voltage between a second two of the three contacts applies voltage to the heater element.

17. The memory according to claim 1, wherein the heating element is parallel to the active zone.

18. A PMC memory comprising:
a memory cell, said cell including,
an inert cathode,
an active zone including a solid electrolyte that includes a chalcogenide material,
at least two contacts that apply a writing voltage to the cell, and
a heating element disposed outside of the active zone that transitionally heats the memory cell during a writing process in the memory cell to a writing temperature higher than an operating temperature of the memory cell outside the writing process, and said heating element being in contact with the inert cathode.

19. The PMC memory according to claim 18, wherein said solid electrolyte comprises a metal-doped chalcogenide.

20. The PMC memory according to claim 19, wherein said metal-doped chalcogenide is selected from the group consisting of AgGeSe, AgGeSbSe, AgGeS, and AsS.

21. A PMC memory comprising:
a memory cell, said memory cell including,
an inert cathode,
an active zone including a solid electrolyte that includes a chalcogenide material,
at least two contacts that apply a writing voltage to the memory cell, and
a heating element disposed outside of the active zone that transitionally heats the memory cell during a writing process in the memory cell to a writing temperature higher than an operating temperature of the memory cell outside the writing process, and said heating element being separated from said inert cathode by at least one of the at least two contacts.

* * * * *